United States Patent [19]

Van Liere

[11] Patent Number: 5,687,476

[45] Date of Patent: Nov. 18, 1997

[54] METHOD OF MAKING PRINTED CIRCUIT ARRANGEMENT

[75] Inventor: Keith A. Van Liere, Jenison, Mich.

[73] Assignee: RobertShaw Controls Company, Richmond, Va.

[21] Appl. No.: 588,966

[22] Filed: Jan. 19, 1996

Related U.S. Application Data

[62] Division of Ser. No. 202,791, Feb. 28, 1994, Pat. No. 5,525,763.

[51] Int. Cl.[6] .................................................. H01R 9/06
[52] U.S. Cl. ........................ 29/843; 29/842; 29/830; 174/250; 174/263
[58] Field of Search .......................... 29/843, 842, 840; 174/250

[56] References Cited

U.S. PATENT DOCUMENTS 3,680,032  7/1972  Masieer et al. .
3,924,918  12/1975  Friend .
3,993,936  11/1976  Meade et al. .
5,259,767  11/1993  Kurbikoff et al. .

FOREIGN PATENT DOCUMENTS 2921211  12/1980  Germany ........................ 29/842

*Primary Examiner*—Carl J. Arbes
*Attorney, Agent, or Firm*—Fulbright & Jaworski LLP

[57] ABSTRACT

A printed circuit board arrangement and method of making the same are provided, the printed circuit board arrangement comprising a first printed circuit board having a component carrying side and an opposite printed circuit side, a second printed circuit board having a component carrying side and an opposite printed circuit side, and securing structure securing the second printed circuit board to the first printed circuit board, the securing structure comprising a plurality of conductive jumper wires each having a generally L-shaped configuration and having opposite ends one of which is secured to the printed circuit side of the second printed circuit board and the other of which is secured to the printed circuit side of the first printed circuit board.

16 Claims, 6 Drawing Sheets

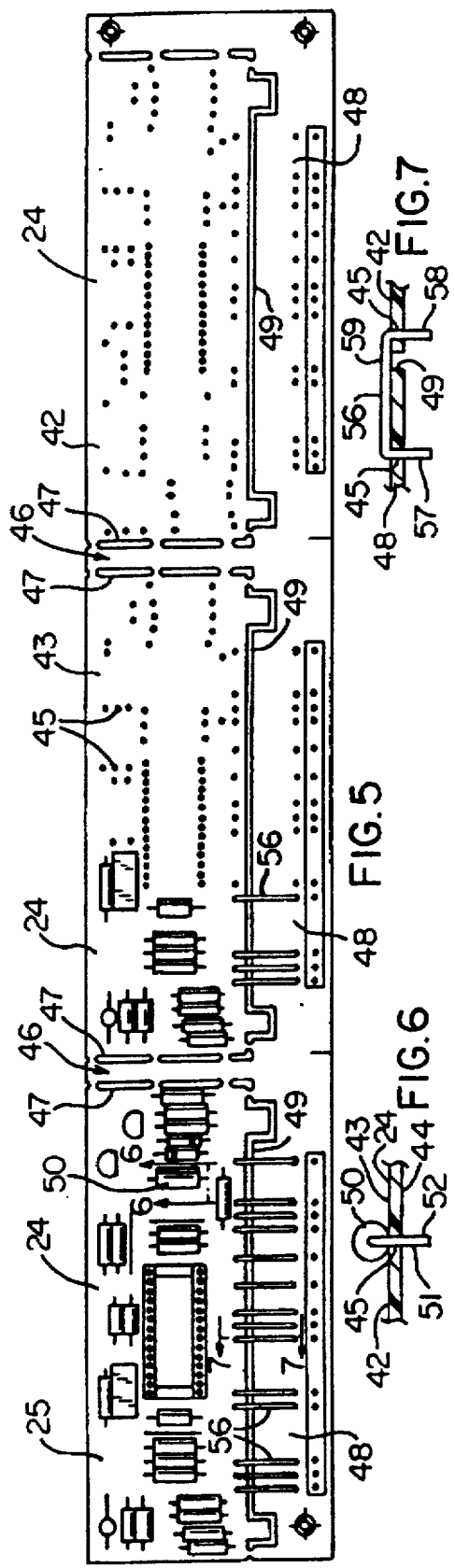

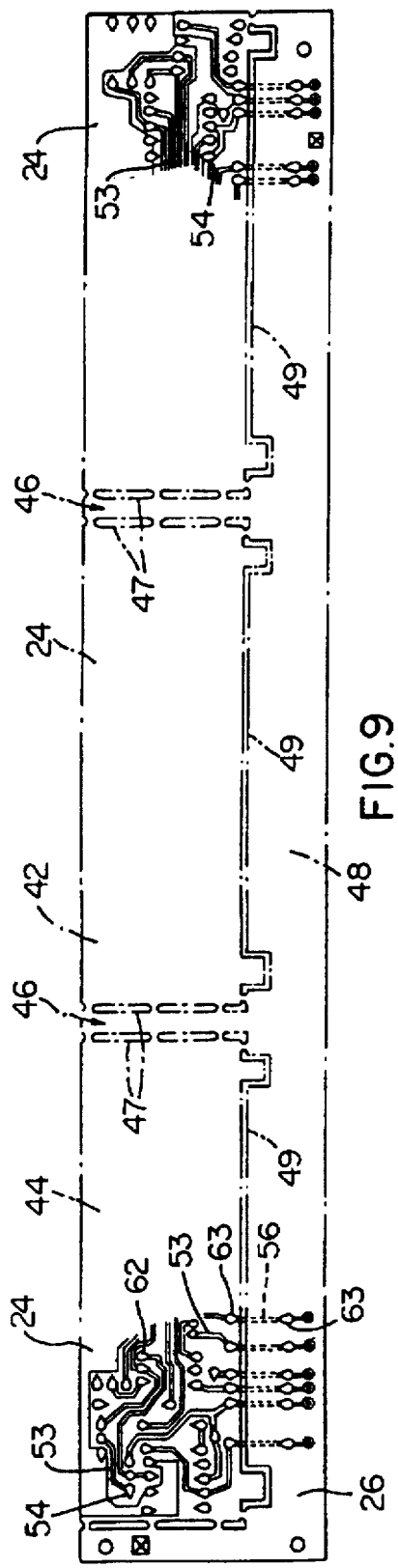
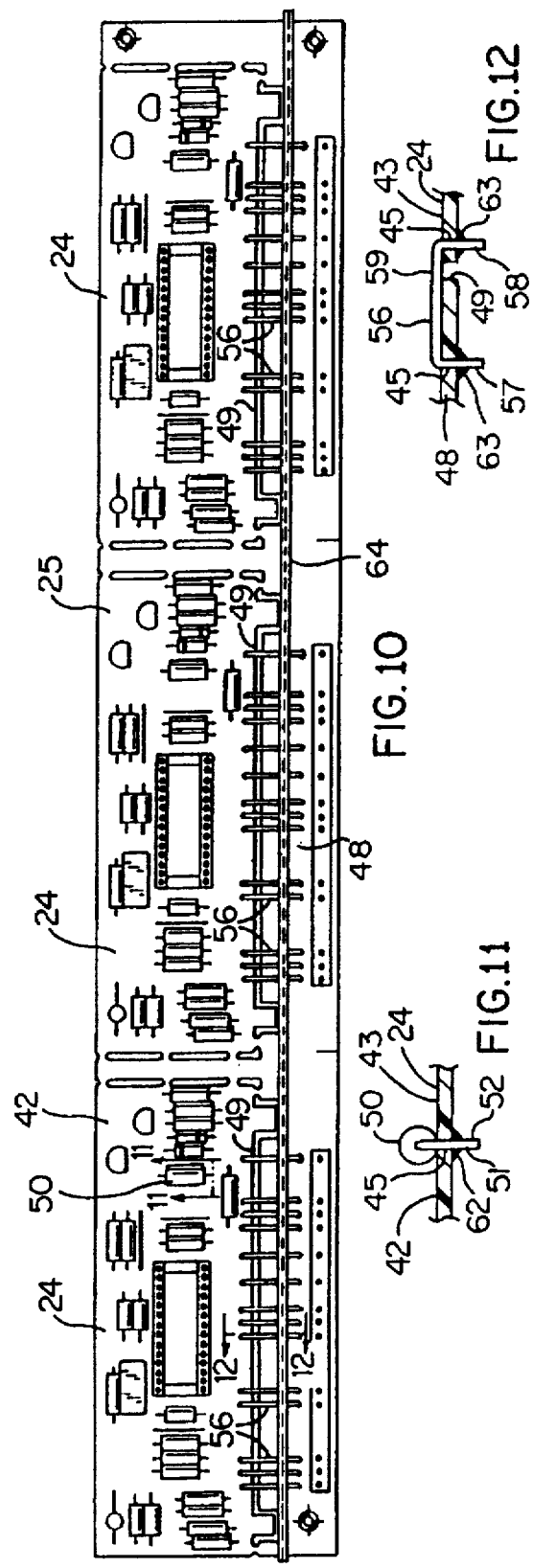

METHOD OF MAKING PRINTED CIRCUIT ARRANGEMENT

This application is a division of application Ser. No. 08/202,791, filed Feb. 28, 1994, now U.S. Pat. No. 5,525,763 issued Jun. 11, 1996.

BACKGROUND OF THE INVENTION

1. Field of the Invention

This invention relates to a new printed circuit board arrangement and to a new method of making such a printed circuit board arrangement.

2. Prior Art Statement

It is known to provide a printed circuit board arrangement comprising a first printed circuit board having a component carrying side and an opposite printed circuit side, a second printed circuit board having a component carrying side and an opposite printed circuit side, and securing means securing the second printed circuit board to the first printed circuit board, the securing means comprising custom tooled pins that are installed by specialized production tooling equipment.

SUMMARY OF THE INVENTION

It is one of the features of this invention to provide a new printed circuit board arrangement wherein the securing means for securing a first printed circuit board and a second printed circuit board together comprises not only low cost structure but also that can utilize conventional insertion assembly equipment for printed circuit boards.

In particular, it was found according to the teachings of this invention that low cost solid conductive jumper wire material can be utilized for interconnecting together the two printed circuit boards and the same can utilize conventional axial insertion assembly equipment.

For example, one embodiment of this invention comprises a printed circuit board arrangement comprising a first printed circuit board having a component carrying side and an opposite printed circuit side, a second printed circuit board having a component carrying side and an opposite printed circuit side, and securing means securing the second printed circuit board to the first printed circuit board, the securing means comprising a plurality of conductive jumper wires each having a generally L-shaped configuration and having opposite end means one of which is secured to the printed circuit side of the second printed circuit board and the other of which is secured to the printed circuit side of the first printed circuit board.

Accordingly, it is an object of this invention to provide a new printed circuit board arrangement having one or more of the novel features of this invention as set forth above or hereinafter shown or described.

Another object of this invention is to provide a new method of making such a printed circuit board arrangement, the method of this invention having one or more of the novel features of this invention as set forth above or hereinafter shown or described.

Other objects, uses and advantages of this invention are apparent from a reading of this description which proceeds with reference to the accompanying drawings forming a part thereof and wherein:

BRIEF DESCRIPTION OF THE DRAWINGS

FIG. 5 is a top view of a circuit board structure for forming a plurality of second printed circuit boards of this invention and having part of the components and securing means of this invention assembled to the component carrying side thereof.

FIG. 6 is an enlarged fragmentary cross-sectional view taken on line 6—6 of FIG. 5.

FIG. 7 is an enlarged fragmentary cross-sectional view taken on line 7—7 of FIG. 5.

FIG. 9 is a rear view of the printed circuit board structure of FIG. 5 after the solder has been applied to the printed circuit side thereof.

FIG. 10 is a view similar to FIG. 5 and illustrates how the jumper wires of the printed circuit board structure are cut to form the L-shape thereof.

FIG. 11 is an enlarged fragmentary cross-sectional view taken on line 11—11 of FIG.

FIG. 12 is an enlarged fragmentary cross-sectional view taken on line 12—12 of FIG. 10.

DESCRIPTION OF THE PREFERRED EMBODIMENT

Figure 1:
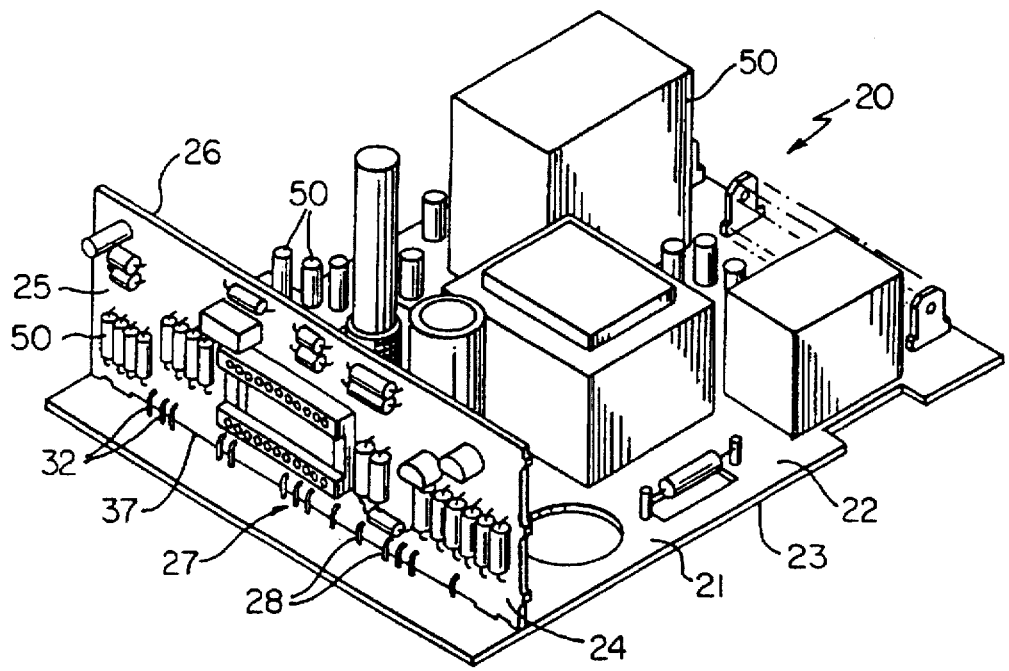
FIG. 1 is a perspective view of the new printed circuit board arrangement of this invention.

While the various features of this invention are hereinafter illustrated and described as being particularly adapted to provide a printed circuit board arrangement having components of particular types arranged in a particular pattern thereon, it is to be understood that the various features of this invention can be utilized singly or in various combinations thereof to provide a printed circuit board arrangement that has other types of components and/or other patterns of such components thereon as desired.

Therefore, this invention is not to be limited to only the embodiment illustrated in the drawings, because the drawings are merely utilized to illustrate one of the wide variety of uses of this invention.

Figure 2:
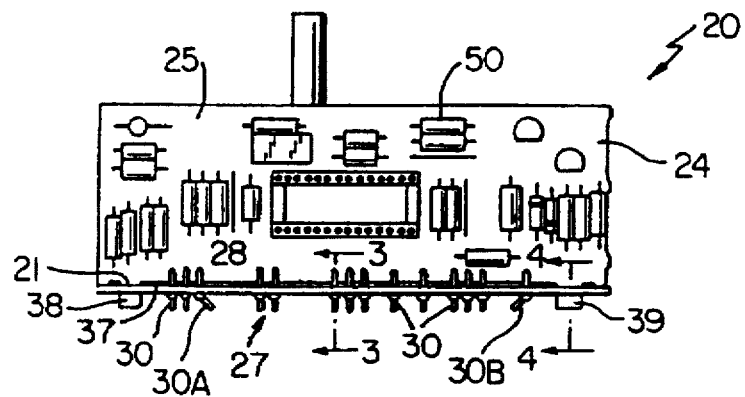
FIG. 2 is a front view of the new circuit board arrangement of FIG. 1 and is taken in the direction of the arrows 2—2 thereof.

Referring now to FIGS. 1 and 2, the new printed circuit board arrangement of this invention is generally indicated by the reference numeral 20 and comprises a first printed circuit board 21 having a component carrying side 22 and an opposite solder or printed circuit side 23 and a second printed circuit board 24 having a component carrying side 25 and an opposite solder or printed circuit side 26, the printed circuit boards 21 and 24 being secured together by unique securing means of this invention that are generally indicated by the reference numeral 27.

Figure 3:
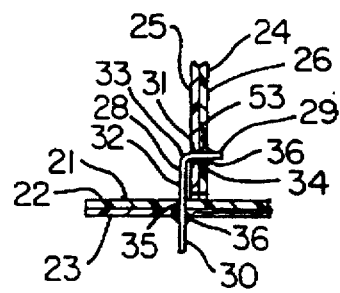
FIG. 3 is an enlarged fragmentary cross-sectional view taken on line 3—3 of FIG. 2.

In particular, at can be seen in FIGS. 1–3 that the unique securing means 27 of this invention comprise a plurality of conductive jumper wires 28 each having a generally L-shaped configuration and having opposite end means 29 and 30, the end means 29 being secured to the printed circuit side 26 of the second printed circuit board 24 and the end means 30 being secured to the printed circuit side 23 of the first printed circuit board 21 as illustrated in FIG. 3.

As further illustrated in FIG. 3 each L-shaped jumper wire 28 has a pair of legs 31 and 32 joined together to define an elbow means 33 of that jumper wire 28 with the legs 31 and 32 being disposed substantially at right angles relative to each other and respectively passing through opening means 34 and 35 in the respective circuit board 24 and 21.

The opposite end means 29 and 30 of each L-shaped jumper wire 28 is respectively secured to the printed circuit side 26 and 23 of the printed circuit boards 24 and 21 by solder 36 in a manner hereinafter set forth.

Figure 15:
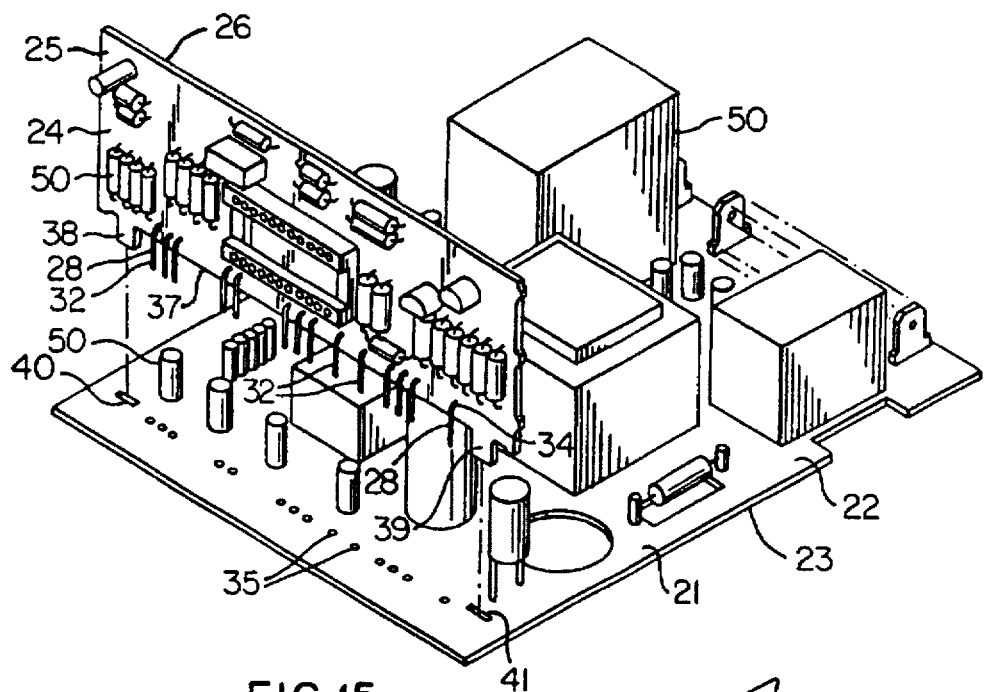
FIG. 15 illustrates how one of the second printed boards of this invention is to be assembled to the component carrying side of a first printed circuit board of this invention, FIG. 15 being an exploded perspective view similar to FIG. 1.

As best illustrated in FIG. 15, the leg 32 of each jumper wire 28 extends beyond an edge means 37 of the second printed circuit board 24 a distance sufficient to permit those legs 32 of the jumper wires 28 to be respectively passed through the openings 35 in the first circuit board 21 and extend beyond the printed circuit side 23 of the printed circuit board 21 so as to permit the solder 36 to secure the same to the printed circuit side 23 in a manner hereinafter set forth.

In addition, it can be seen in FIG. 2 that two integral tabs 38 and 39 of the second printed circuit board 24 extend beyond the edge 37 thereof with the tabs 38 and 39 each being substantially rectangular and with the tab 39 having a longer width than the width of the tab 38 to provide for proper orientation of the second printed circuit board 24 in the assembly thereof with the first printed circuit board 21.

Figure 4:
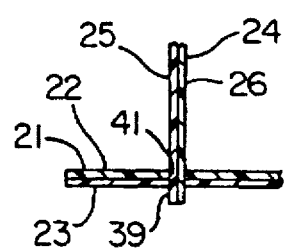
FIG. 4 is an enlarged fragmentary cross-sectional view taken on line 4—4 of FIG. 2.
Figure 8:
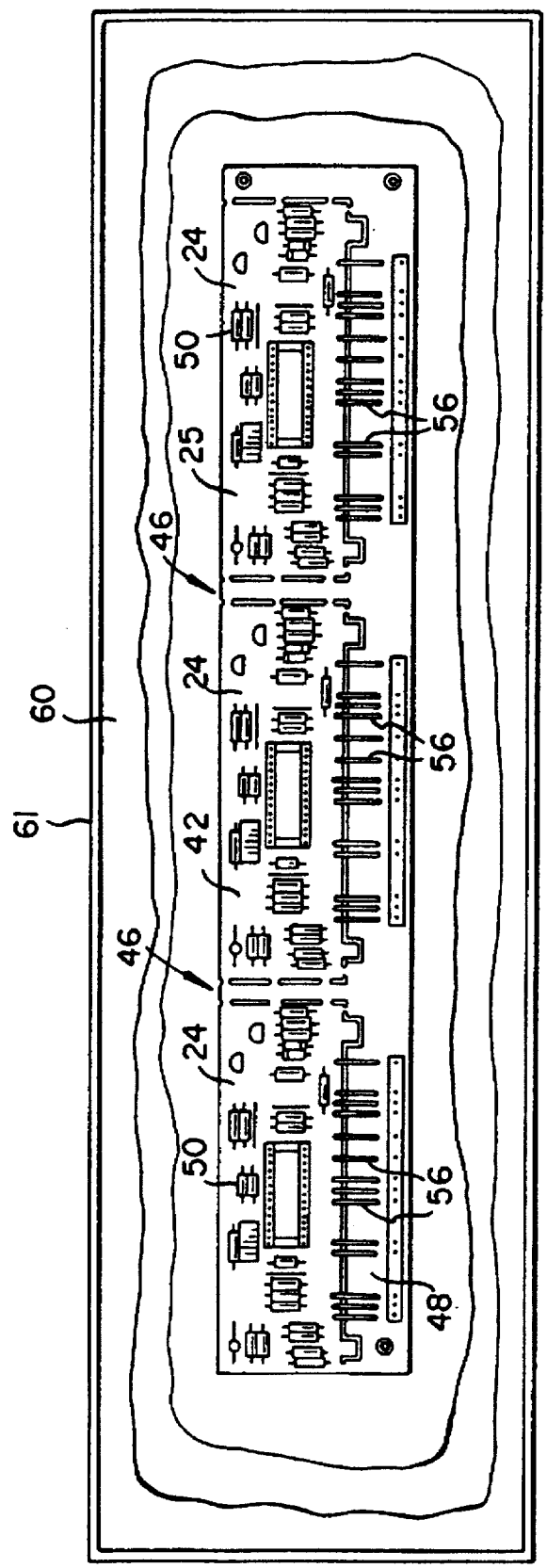
FIG. 8 is a reduced schematic view illustrating how solder is applied to the printed circuit side of the structure of FIG. 5 after all of the components and securing means have been assembled thereto.

In particular, the first printed circuit board 21 has elongated openings 40 and 41 formed therethrough and each being of a size or length to receive the respective tabs 38 and 39 therethrough when the printed circuit board 24 is assembled to the printed circuit board 21 by the legs 32 being received in the openings 35 and pushed downwardly as illustrated in FIG. 15 at the same time that the tabs 38 and 39 are pushed downwardly into the openings 40 and 41 as illustrated in FIGS. 2 and 4 to permit at least some of the edge means 37 to be disposed against or closely adjacent the component carrying side 22 of the first printed circuit board 21 in the manner illustrated in FIG. 2 whereby the second printed circuit board 24 can only have the component carrying side 25 thereof facing in the direction illustrated in FIG. 2 and not be rotated 180 degrees relative thereto because the tab 39 of the board 24 is too wide to be received in the opening 40 of the board 21.

In order to initially hold the printed circuit board 24 in its assembled relationship with the printed circuit board 21 before the solder 36 is applied, two or more of the end means 30 of the legs 32 of the jumper wires 28 can be physically bent at an angle relative to the board 21, such as by the ends 30A and 30B illustrated in FIG. 2, so that the arrangement 20 can be handled as an assembled unit before and while the solder 36 is being applied thereto in a manner hereinafter set forth.

While the second printed circuit board 24 can be formed in any suitable manner to have the jumper wires 28 for securing the same to the printed circuit board 21, one working embodiment of the method of this invention comprises the step of forming a plurality of such printed circuit boards 24 from a single elongated blank 42 of printed circuit board material that has a component carrying side 43 and a printed circuit side 44, FIG. 6, with the printed circuit blank 42 being formed of any suitable material and in any suitable manner that is well known in the printed circuit board art.

Figure 13:
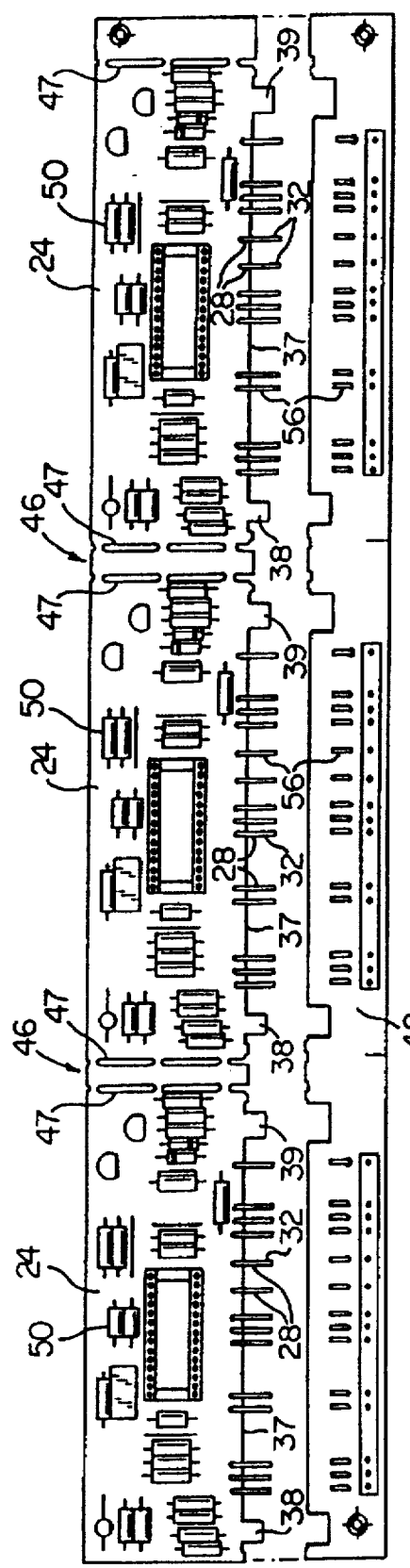
FIG. 13 is a view of the printed board structure of FIG. 10 after the jumper wires have been cut and after a section of the printed circuit board structure is broken away so as to define a particular edge means of the remaining printed board structure.

The blank 42 has a plurality of openings 45 passing therethrough in a repeating pattern so as to define in FIGS. 5–14 three printed circuit boards 24 when the same are subsequently broken away from the blank 42 at separation areas 46 defined by elongated breakaway openings 47, each printed circuit board 24 having a section 48 of the blank 42 which will be subsequently broken away from the same as provided by elongated breakaway openings 49 that will not only define the edge 37 of the respective board 24, but also will create the tabs 38 and 39 as illustrated in FIG. 13.

Suitable axial insertion equipment that is well known in the art is utilized to assemble a plurality of components 50 to the component carrying side 43 of the blank 42 with each component 50 having terminal means 51 adapted to pass through respective openings 45 in the blank 42 so that a portion 52 of each terminal 51 extends beyond the printed circuit side 44 of the blank 42 as illustrated in FIG. 6, the components 50 being any well known components in the printed circuit art, such as resistors, capacitors, transistors, microcomputers, etc. and when building a plurality of circuit boards 24, such pattern of components 50 is repeated in each section that is to provide an individual printed circuit board 24 as illustrated.

As is well known in the art, and as illustrated in FIG. 9, the printed circuit side 44 of the blank 42 has conductive printed lines or leads 53 that are electrically insulated from the exterior surface of the side 44 and that interconnect together exposed conductive areas 54 on the side 44, each conductive area 54 having an opening 45 passing therethrough so that a terminal 51 of a component 50 can be soldered to that area 54 so as to be conductively interconnected to the circuit lead or line 53 which, as previously stated, is electrically insulated from the exterior of the side 44 in a manner well known in the art.

The L-shaped jumper wires 28 of this invention are formed from larger U-shaped jumper wires 56 that are also assembled by the conventional axial insertion equipment to the blank 42 so as to have the legs 57 and 58 thereof respectively passed through an opening 45 in the blank 42 and an opening 45 in the section 48 of the blank 42 as illustrated in FIGS. 5 and 7. Thus, it can be seen in FIGS. 5 and 7 that a cross member 59 of each L-shaped jumper wire 56 bridges the break away area 49 that subsequently defines the edge means 37 of the individual circuit board 24.

When the blank 42 has all of the components 50 and U-shaped jumper wires 56 assembled thereto in the manner previously set forth, the printed circuit side 44 thereof is passed over a molten wave solder bath 60 of a wave solder means 61 in a manner well known in the art so that liquid solder is applied to the side 44 to not only solder the terminals 51 of the components 50 to the printed circuit side 44 of the blank 42, but also to solder the legs 57 and 58 of each U-shaped jumper wire 56 to the printed circuit side 44 of the blank 42 and the section 48 thereof as illustrated by the solder 62 in FIGS. 9 and 11 and by the solder 63 illustrated in FIGS. 9 and 12.

Thus, it can be seen that the legs 57 of the U-shaped jumper wires 56 are electrically interconnected to the printed circuit 53 of the board 44 by the solder 63 and the respective conductive area 54 for a purpose hereinafter described.

After the blank 42 has passed over the wave solder apparatus 61 and the solder 62 and 63 has hardened, suitable cutting means, such as cutting bar 64 of FIG. 10, is utilized to simultaneously cut through all of the U-shaped jumper wires 56 to convert the same to the L-shaped jumper wires 28 of this invention as the cross members 56 are cut in such a position that the legs 58 are removed and the remaining portion of the cross members 56 becomes the legs 32 as illustrated in FIG. 13 when the section 48 of the blank 42 is removed at the removable area 49 after the cutter bar 64 has performed its cutting function on the cross members 59 of the U-shaped jumper wires 56. Of course, the cross members 59 can be cut and the section 48 can be removed in substantially a simultaneous operation, as desired.

Figure 14:
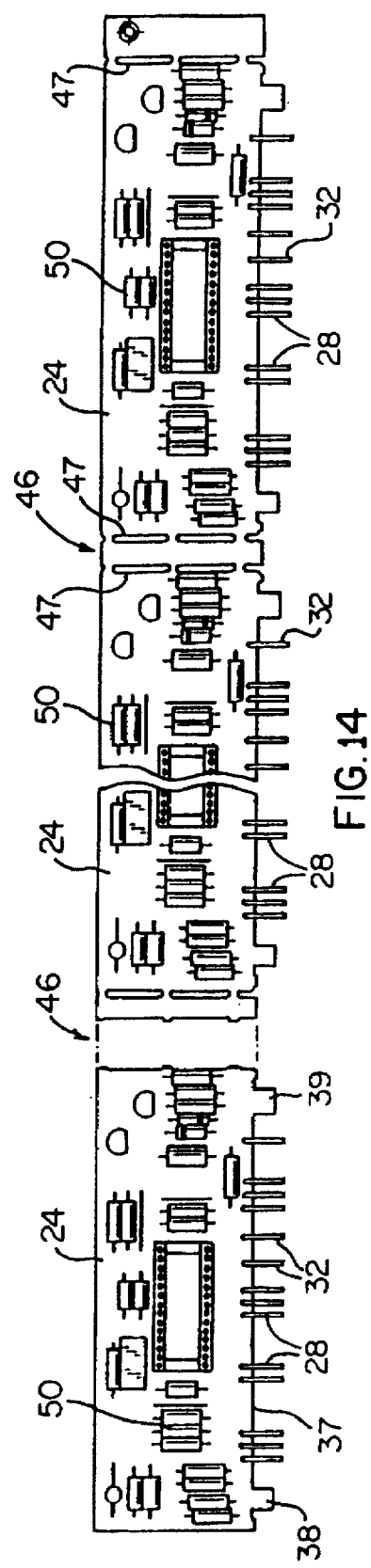
FIG. 14 is a view similar to FIG. 13 and illustrates how the individual second circuit boards of this invention are broken away from the structure of FIG. 13.

After the section 48 of the blank 42 is broken away in the manner illustrated in FIG. 13, the individual circuit boards 24 can then be broken away from each other in the manner illustrated in FIG. 14 so that each printed circuit board 24 now has not only the components 50 with the terminals 51 thereof soldered to the printed circuit side 26 of the board 24, but also has the end means 29 of the legs 31 of the jumper wires 28 soldered to the printed circuit side 26 of the board 24 and in electrical contact with the circuit means 53 thereof for the reasons previously set forth.

The printed circuit board 21 of this invention also has components 50 disposed on the component carrying side 22 thereof with the components having terminals (not shown) extending beyond the printed circuit side 23 thereof in the same manner that the components 50 on the board 24 had the terminals 51 extending beyond the printed circuit side 26 thereof for subsequent soldering thereto.

Figure 16:
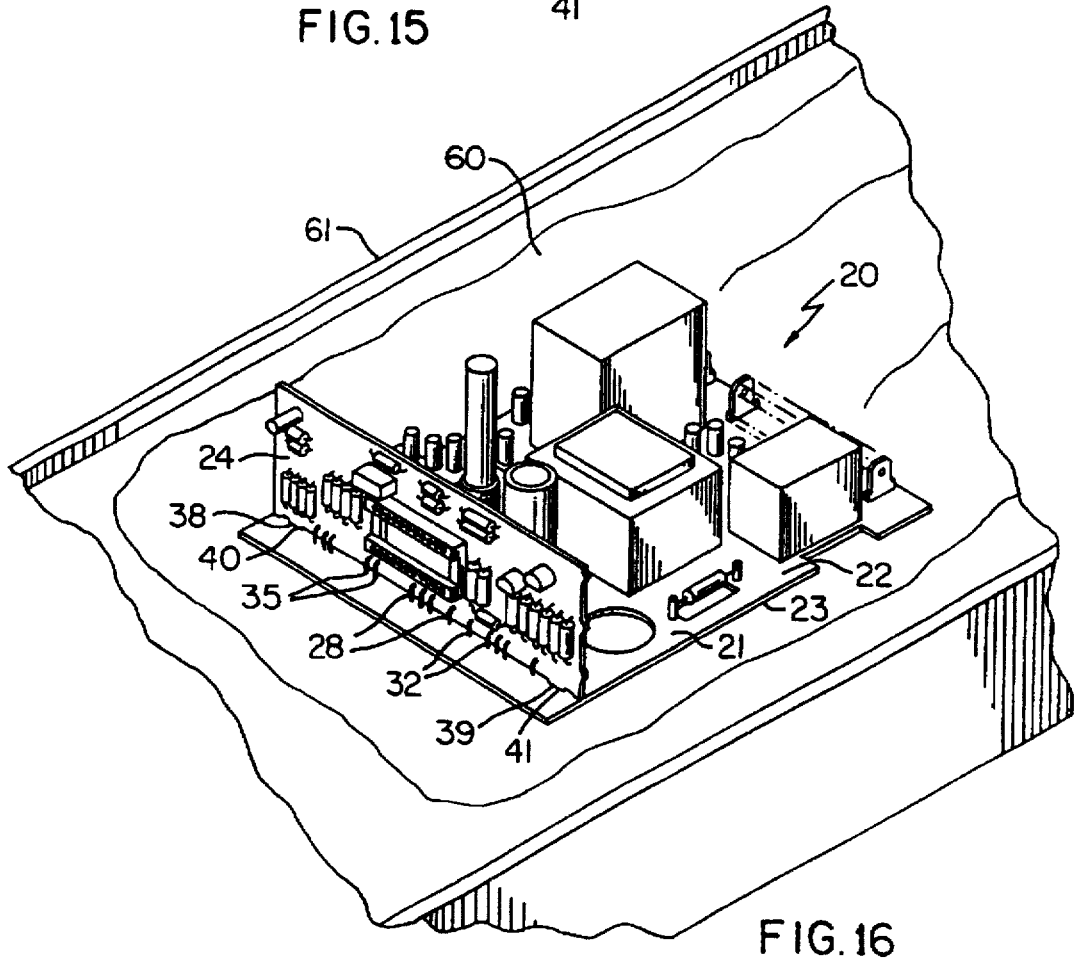
FIG. 16 schematically illustrates how solder is applied to the printed circuit side of the first printed circuit board of this invention after the second printed circuit board of this invention has been assembled thereto so as to complete the new printed circuit board arrangement of this invention that is illustrated in FIG. 1.

However, before the components 50 of the board 21 are soldered thereto, the printed circuit board 24 is assembled to the printed circuit board 21 in the manner illustrated in FIG. 15 by having the legs 32 of the L-shaped jumper wires 28 received in the openings 35 of the printed circuit board 21 and with the tabs 38 and 39 of the printed circuit board 24 received in the slots 40 and 41 so that the end means 30 of the L-shaped jumper wires 28 extend beyond the printed circuit side 23 of the board 21 and, as previously stated, two or more of those end means 30 could be bent at an angle as illustrated in FIG. 2 to retain the board 24 in its assembled relation with the board 21. The arrangement 20 is then subsequently passed over the molten wave solder bath 60 of the wave solder apparatus 61 in the manner illustrated in FIG. 16 to not only solder the terminals of the components 50 to the printed circuit side 23 of the board 21, but also to solder the end means 30 of the L-shaped jumper wires 28 to the printed circuit side 23 of the board 21 and electrically interconnect the legs 32 of the L-shaped jumper wires 28 to the circuit means of the printed circuit board 21 in the same manner that the legs 31 are electrically interconnected to the circuit means 53 of the printed circuit board 24.

Thus, once the solder has hardened on the printed circuit side 23 of the printed circuit board 21, the printed circuit board arrangement 20 of this invention is completed and the arrangement 20 can be utilized in any suitable housing of a control device or the like in a manner well known in the art for assembling completed printed circuit board arrangements with housing means.

Thus, it can be seen that the method of this invention comprises a low cost method of increasing printed circuit board density by inserting components on a secondary or satellite printed circuit board 24 and using that printed circuit board 24 as a component that is inserted on the main printed circuit board 21.

In addition, in one working embodiment of this invention, low cost AWG22 non-insulated solid tinned copper wire is utilized to form the U-shaped jumper wires 56 that were inserted by through hole axial insertion equipment and then soldered during a conventional wave solder process that not only solders the terminals of the components 50 to the printed circuit board 24, but also solders the legs 57 and 58 of the U-shaped jumper wires 56 thereto as previously set forth.

In such one working embodiment of this invention, the legs 59 of the U-shaped jumper wires 56 are each approximately 12 mm long whereas the resulting legs 32 of the L-shaped jumper wires 28 are each approximately 7 mm long. Also, the printed circuit board 21 is approximately 11 cm×9 cm and the printed circuit board 24 is approximately 9 cm×3 cm with the boards 21 and 24 each being approximately 1.5 mm thick.

Of course, this invention is not to be limited to the dimensions of the previously described one working embodiment as such dimensions are merely set forth as one example of this invention.

Thus, it can be seen that this invention not only provides a new printed circuit board arrangement, but also this invention provides a new method of making such a printed circuit board arrangement.

While the forms and methods of this invention now preferred have been illustrated and described as required by the Patent Statute, it is to be understood that other forms and method steps can be utilized and still fall within the scope of the appended claims wherein each claim sets forth what is believed to be known in each claim prior to this invention in the portion of each claim that is disposed before the terms "the improvement" and sets forth what is believed to be new in each claim according to this invention in the portion of each claim that is disposed after the terms "the improvement" whereby it is believed that each claim sets forth a novel, useful and unobvious invention within the purview of the Patent Statute.

What is claimed is:

1. A method of making a printed circuit board arrangement having a first printed circuit board with a first component carrying side and a first opposite printed circuit side and a second printed circuit board with a second component-carrying side and a second opposite printed circuit side comprising the steps of:

forming a securing means having a plurality of conductive jumper wires, each jumper wire having a generally L-shaped configuration and opposite end means;

securing one of said opposite end means to said first printed circuit side and securing another of said opposite end means to said second printed circuit side;

forming an opening means passing through said first printed circuit board;

forming a tab means extending from said second printed circuit board and disposing said tab means in said opening means.

2. A method of making a printed circuit board arrangement as set forth in claim 1 further comprising the step of:

forming said printed circuit side of each printed circuit board to comprise an electrical circuit before the step of forming a securing means.

3. A method of making a printed circuit board arrangement as set forth in claim 2 wherein the step of securing comprises the step of:

electrically interconnecting each of said jumper wires to a part of said electrical circuit of said first printed circuit board and to a part of said electrical circuit of said second printed circuit board.

4. A method of making a printed circuit board arrangement as set forth in claim 1 wherein the step of forming a securing means comprises the step of:

forming each jumper wire to have legs joined together to form an elbow means with said opposite end means remote from said elbow means.

5. A method of making a printed circuit board arrangement as set forth in claim 4 wherein the step of securing comprises the steps of:

forming each said printed circuit board to have a plurality of openings passing through each of said sides; and placing a part of one of said legs in one of said openings of said first printed circuit board and placing a part of another of said legs in one of said openings of said second printed circuit board.

6. A method of making a printed circuit board arrangement as set forth in claim 5 wherein the step of securing further comprises the steps of:

extending each end means of each said jumper wire beyond said printed circuit side of the respective printed circuit board; and soldering each said end means, to a part of said electrical circuit of the respective printed circuit board.

7. A method of making a printed circuit board arrangement as set forth in claim 1, wherein said opening means comprises two openings that have different sizes and said tab means comprises two tabs that have different sizes, whereby said two openings and said two tabs orient said printed circuit boards together.

8. A method of making a printed circuit board arrangement as set forth in claim 1, wherein said step of forming a securing means comprises the steps of:

forming said second printed circuit board to have a removable section that defines an edge means of said second printed circuit board when said section is removed;

forming a plurality of cooperating pairs of openings through said section;

attaching a plurality of generally U-shaped conductive jumper wires, each with legs disposed in a pair of said openings and with a cross member bridging said edge means;

securing said legs of each said U-shaped jumper wire to said second printed circuit side and to said section;

cutting through said cross member of each said U-shaped jumper wire to define one of said L-shaped jumper wires secured to said second printed circuit board and having said another end means extending a certain distance beyond said edge means;

removing said section;

forming openings through said first printed circuit board;

disposing said another end means of said L-shaped jumper wires through said openings of said first printed circuit board; and securing said another end means of said L-shaped jumper wires to said first printed circuit side.

9. A method of making a printed circuit board arrangement as set forth in claim 8, wherein the step of securing said legs comprises the step of:

soldering said legs of each said U-shaped jumper wire to said second printed circuit side and to said section.

10. A method of making a printed circuit board arrangement as set forth in claim 8 further comprising the step of:

disposing components on said second component-carrying side so that a terminal means of said second printed circuit board extends beyond said second printed circuit side before the step of forming said second printed circuit board to have a removable section.

11. A method of making a printed circuit board arrangement as set forth in claim 10, wherein the step of securing said another end means comprises the step of:

soldering said another end means to said first printed circuit side.

12. A method of making a printed circuit board arrangement as set forth in claim 11 further comprising the step of:

substantially simultaneously soldering said terminal means to said second printed circuit side after the step of soldering said another end means.

13. A method of making a printed circuit board arrangement as set forth in claim 10 further comprising the step of:

disposing components on said first component-carrying side so that a terminal means of said first printed circuit board extends beyond said first printed circuit side before the step of forming said second printed circuit board to have a removable section.

14. A method of making a printed circuit board arrangement as set forth in claim 8 further comprising the step of:

bending certain of said another end means relative to said first printed circuit board after the step of disposing said another end means and before the step of securing said another means.

15. A method of making a printed circuit board arrangement as set forth in claim 8 further comprising the steps of:

forming an opening means passing through said first printed circuit board; and forming a tab means extending from said second printed circuit board for positioning in said opening means.

16. A method of making a printed circuit board arrangement as set forth in claim 15 wherein said opening means comprises two openings that have different sizes and said tab means comprises two tabs that have different sizes, whereby said two openings and said two tabs orient said printed circuit boards together.

* * * * *